(12) United States Patent
Gebhardt et al.

(10) Patent No.: US 6,492,817 B2
(45) Date of Patent: Dec. 10, 2002

(54) ELECTRICAL CONDUCTOR ARRANGEMENT

(75) Inventors: Matthias Gebhardt, Erlangen (DE); Ralph Oppelt, Uttenreuth (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/861,759

(22) Filed: May 21, 2001

(65) Prior Publication Data

US 2001/0050176 A1 Dec. 13, 2001

(30) Foreign Application Priority Data

May 24, 2000 (DE) .......................................... 100 25 582

(51) Int. Cl.[7] ................................................ G01V 3/00
(52) U.S. Cl. ....................... 324/318; 324/322

(58) Field of Search ................................. 324/300, 306, 324/307, 309, 312, 314, 318, 322

(56) References Cited

U.S. PATENT DOCUMENTS

| 5,309,107 A | | 5/1994 | Pausch ........................ 324/318 |
| 5,614,872 A | | 3/1997 | Heid ........................... 324/320 |
| 6,067,001 A | * | 5/2000 | Xu et al. ...................... 324/319 |
| 6,344,745 B1 | * | 2/2002 | Reisker et al. .............. 324/318 |

FOREIGN PATENT DOCUMENTS

DE 197 26 332 12/1998

* cited by examiner

*Primary Examiner*—Louis Arana
(74) *Attorney, Agent, or Firm*—Schiff Hardin & Waite

(57) ABSTRACT

An electrical conductor arrangement has conductor meshes that are arranged in areas with limiting lines defined by a network structure, and into which control devices are connected for the control of currents within the conductor arrangement.

25 Claims, 16 Drawing Sheets

ELECTRICAL CONDUCTOR ARRANGEMENT

BACKGROUND OF THE INVENTION

1. Field of the Invention

The invention is directed to an electrical conductor arrangement, particularly for a magnetic resonance apparatus.

2. Description of the Prior Art

Electrical conductor arrangements are utilized in many areas of technology, for example for generating predetermined magnetic fields. In a magnetic resonance apparatus, thus, rapidly switched gradient fields that are generated by a gradient coil system are superimposed on a static basic magnetic field that is generated by a basic magnetic field magnet system. A conductor arrangement of a gradient coil of the gradient coil system can be defined, for example, according to a method as described in German OS 42 03 582 and/or German OS 197 26 332. Further, the magnetic resonance apparatus has a radiofrequency system that emits radiofrequency signals into an examination subject for triggering magnetic resonance signals and that picks up the generated magnetic resonance signals on the basis of which magnetic resonance images are produced.

A gradient coil of the gradient coil system generates a gradient field for a specific spatial direction. This gradient field has only one principal field component that is co-linear with the basic magnetic field, at least within a linearity volume in the desirable, ideal case. The principal field component has a prescribable principal gradient that, independent of location, is of approximately the same size at every arbitrary point in time, at least within the linearity volume. Since the gradient field is a temporally variable magnetic field, the above in fact applies for every point in time; an intensity of the principal gradient, however, is variable from one point in time to another point in time.

Due to Maxwell's fundamental equations and contrary to the desired ideal case, however, no gradient coils can be fashioned that exclusively produce the principal field component over the linearity volume. At least one accompanying field component that is directed perpendicularly to the principal field component accompanies the principal field component. In some applications, the accompanying field components of gradient fields lead to a falsification of examination results.

The gradient coil system is usually surrounded by conductive structures wherein eddy currents are induced by the switched gradient fields. Examples of such conductive structures are the inner cryoshield of a superconductive basic field magnet system, the copper foil of the radiofrequency shielding and the gradient coil system itself. The fields generated by the eddy currents are undesired because, among other things, they weaken the gradient field unless counter-measures are taken and distort it in terms of its time curve. For example, this leads to degradations in the quality of magnetic resonance images.

The eddy current fields can be compensated to a certain extent by a corresponding pre-distortion of a reference current quantity of the gradient coil. However, only eddy current fields that similarly image the gradient field in a mathematical sense, i.e. are similar to the gradient field in terms of their field course, can be compensated by the pre-distortion. Since the eddy currents also do not similarly image the gradient field, additional, spatial field distortions of a higher order arise. Given actively shielded gradient coil systems, these latter field distortions can be compensated by a corresponding arrangement of conductors of shielding coils. This requires a correspondingly high mechanical precision in the structure of the gradient coil system, which involves high manufacturing costs.

In magnetic resonance technology, a homogeneity of the basic magnetic field is a decisive factor for the quality of the magnetic resonance images. Field inhomogeneities of the basic magnetic field within an imaging volume of the magnetic resonance apparatus thereby cause geometrical distortions of the magnetic resonance image that are proportional to the field inhomogeneities. The field inhomogeneity is especially important in fast pulse sequences, for example in the echo planar method.

Measures for improving the basic magnetic field homogeneity are referred to as shimming measures. A distinction is made between passive and active shimming measures. In the active shimming measure, correction coils, referred to as shim coils, are utilized in a shim coil arrangement, these homogenizing the basic magnetic field. A power pack device that delivers highly constant and reproducibly adjustable dc currents is required for the operation of the shim coil arrangement.

As disclosed, for example, in German AS 195 11 791. the basic magnetic field within he imaging volume can be described with coefficients of spherical harmonic functions. This German Patent also discloses that linear basic magnetic field deviations, i.e. field disturbances of the first order, can be compensated by charging gradient coils with an offset current. The offset current is a constant current that is superimposed on a current implementing a gradient sequence. For compensating field inhomogeneities of a higher order, a shim coil that essentially compensates the corresponding field disturbance and that is charged with a suitable current for this purpose is respectively provided according to the order to be compensated. Since a shim coil is to be provided for each order to be compensated but the space that is available for shim coils, for example within the gradient coil system, is tightly limited, limits are placed on the aforementioned compensation.

SUMMARY OF THE INVENTION

An object of the invention is to provide an improved electrical conductor arrangement, particularly for a use in a magnetic resonance apparatus, with which, among other things, the aforementioned disadvantages of the known arrangements can be alleviated.

This object is achieved in accordance with the principles of the present invention in an electrical conductor arrangement, particularly for a magnetic resonance apparatus, having a number of conductor meshes which are arranged in areas limiting lines defined by a network structure, and a number of control devices electrically connected in the respective conductor meshes for generating respective currents in the conductor arrangement.

A selected planar current distribution can be set and regulated as desired in a broad range as a result of an inventive electrical conductor arrangement that has conductor meshes that are arranged in surfaces whose limiting lines are determined by a network structure and into which control devices that are fashioned for the control of currents within the conductor arrangement are electrically linked. For example, the inventive electrical conductor arrangement represents a flexibly employable magnetic field generating unit wherein the field properties can be freely parameterized, at least within a broad range.

In an especially advantageous way, the inventive electrical conductor arrangement can be utilized in a magnetic resonance apparatus, for example within a gradient coil system, for compensating field errors as a consequence of eddy currents and/or of accompanying field components of gradient fields and/or of inhomogeneities of a basic magnetic field. For setting the corresponding planar current distribution, the control devices are parameterized or controlled using known pulse sequences for location-dependent field dynamics and known design methods for determining an optimum planar current distribution given gradient coils. The method for setting currents in a shim coil arrangement according to the initially cited German AS 195 11 791 is referenced by an example of known pulse sequences for location-dependent field dynamics. German OS 42 03 582, which has likewise already been cited, is an example of known design methods for determining an optimum planar current distribution. With the inventive electrical conductor arrangement, which, for example, always has an identical structure in hardware terms, magnetic field distortions as a consequence of individual manufacturing tolerances of magnetic field-generating components of a magnetic resonance apparatus can be individually compensated in a simple way by a corresponding parameterization of the control devices of the conductor arrangement.

In one embodiment, the inventive electrical conductor arrangement is fashioned as a flexible printed circuit board constructed single-layer or multi-layer. Given use in a gradient coil system of a magnetic resonance apparatus, for example, this can be cast together with further components of the gradient coil system.

In addition to being employed as a field-correcting device, one or more of the inventive electrical conductor arrangements can be utilized in a magnetic resonance apparatus as magnetic field-generating components in the sense of a gradient coil and/or of a basic field magnet and/or as an apparatus in the sense of a radiofrequency antenna for transmitting radiofrequency signals and/or for receiving magnetic resonance signals.

DESCRIPTION OF THE PREFERRED EMBODIMENTS

Figure 1:
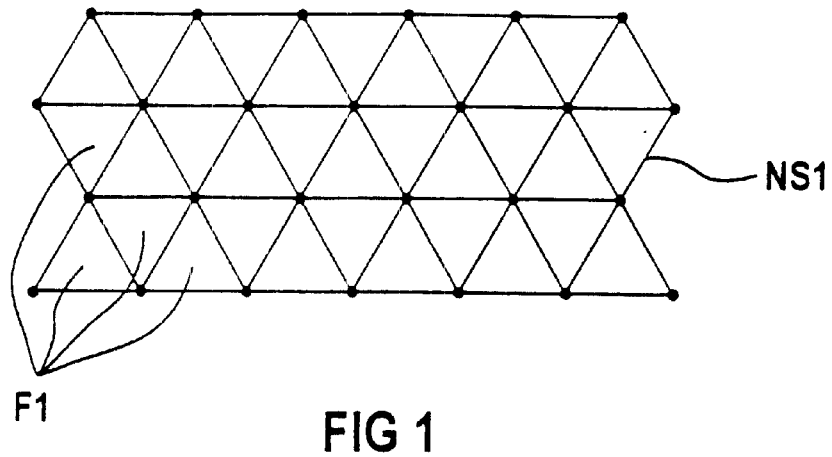
FIGS. 1–6 respectively show different embodiments of the invention as regular network structures with surfaces of the same geometrical shape.
Figure 2:
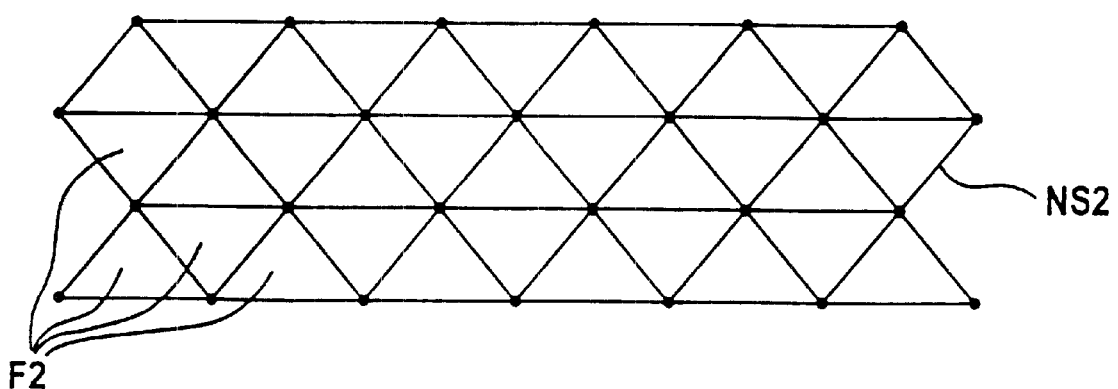
Figure 3:
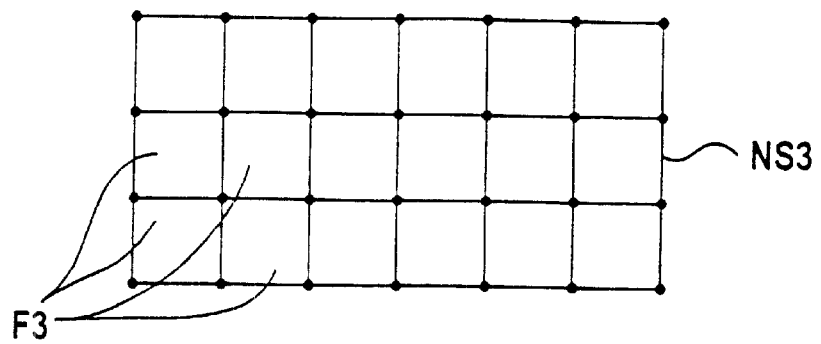
Figure 4:
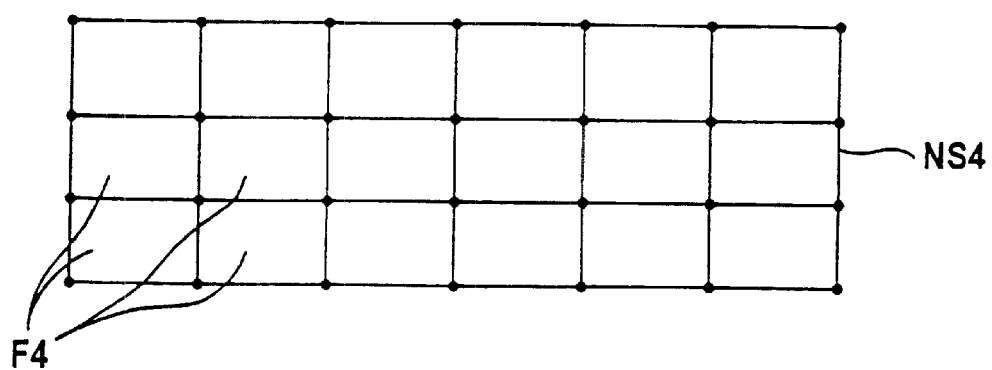
Figure 5:
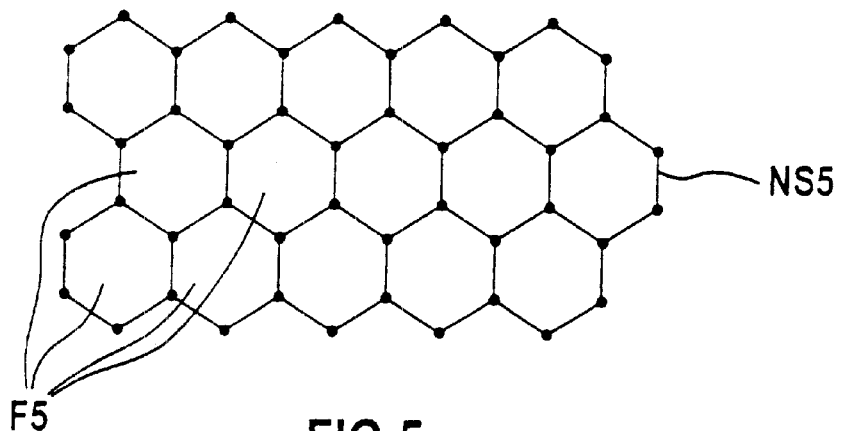
Figure 6:
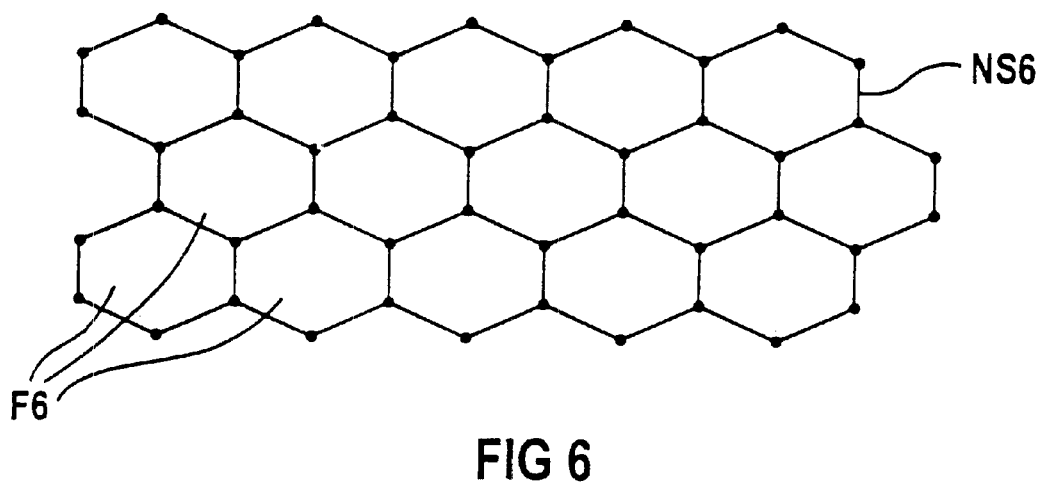

As exemplary embodiments of the invention, FIGS. 1 through 6 show regularly constructed network structures NS1 through NS6. Only three different n-corner areas are thereby possible with which a network structure with gap-free "tiles" can be formed from a surface having a specific geometrical form, namely for n=3, 4 and 6. FIGS. 1, 3 and 5 show planar network structures NS1, NS3 and NS5 with areas F1, F3 and F5 of equilateral triangles, squares and equilateral hexagons. In a further embodiment, area-limiting polygons are also usable, these proceeding from the aforementioned, regular polygons by a one-dimensional distortion or by a clipping. FIGS. 2, 4 and 6 show planar network structures with areas F2, F4 and F6 that proceed from a one-dimensional distortion of the network structures NS1, NS3 and NS5.

For forming a conductor arrangement, respective conductor meshes are arranged in the areas F1 through F6. The conductor meshes are either arranged electrically insulated from one another, or the conductor meshes are arranged according to the limiting lines of the areas F1 through F6, whereby conductor meshes adjoining one another in the region of a shared limiting line are formed by a shared conductor path, so that a conductor network arises.

Figure 7:
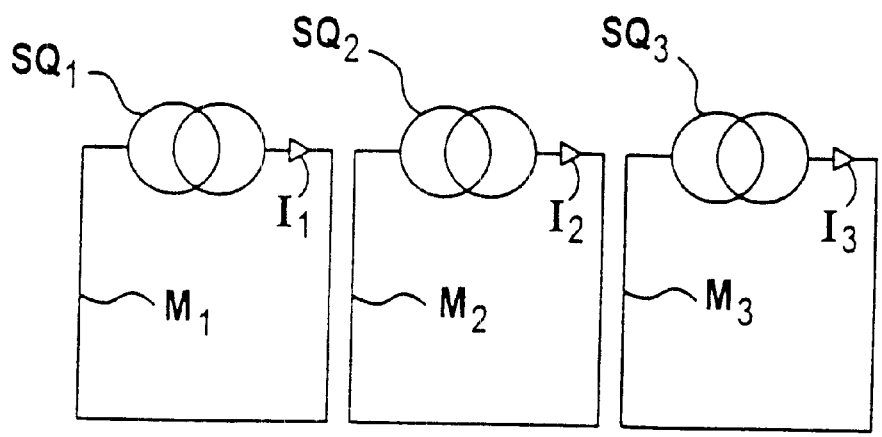
FIG. 7 shows an inventive conductor arrangement with conductor meshes insulated from one another.
Figure 8:
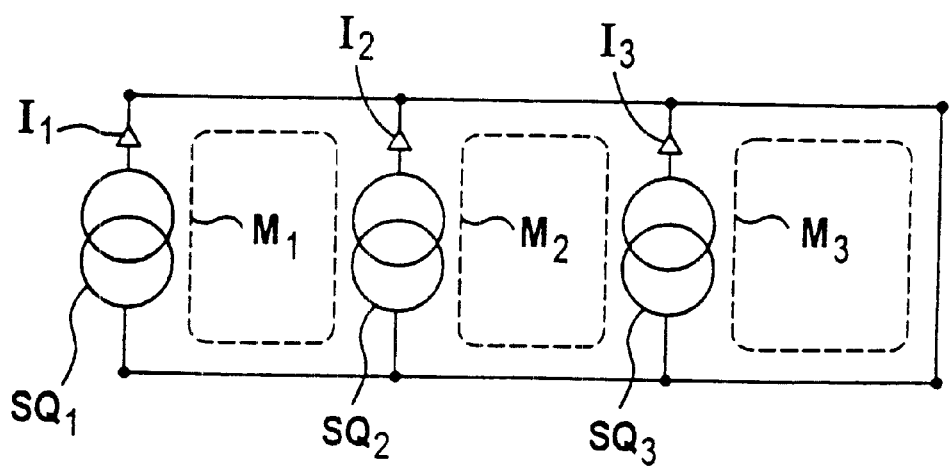
FIG. 8 shows an inventive a conductor arrangement as a conductor network of conductor meshes electrically connected to one another.

As an example, FIGS. 7 and 8 show a conductor arrangement with conductor meshes insulated from one another and a conductor arrangement with conductor meshes electrically connected to form a conductor network. As control devices for setting currents within the conductor arrangement, each of the conductor meshes $M_1$ through $M_3$ has at least one current source $SQ_1$ through $SQ_3$ that exhibit a very high internal resistance. Source currents $I_1$ through $I_3$ of the current sources $SQ_1$ through $SQ_3$ accordingly propagate via current paths free of current sources, and they do not close via conductor paths with current sources.

As an example, FIG. 7 shows a conductor arrangement composed of three conductor meshes $M_1$ through $M_3$ insulated from one another, whereby each of the conductor meshes $M_1$ through $M_3$ contains a current source $SQ_1$ through $SQ_3$ controllable independently from one another. The source currents $I_1$ through $I_3$ to be set by the current sources $SQ_1$ through $SQ_3$ amount, for example, to 1 A, 2 A and 3 A. The currents $I_1$ and $I_2$ as well as $I_2$ and $I_3$ thereby partially mutually compensate in the regions wherein the conductor meshes $M_1$ through $M_3$ comprise parallel, vertical conductor paths proceeding in close proximity to one another.

FIG. 8 shows a conductor arrangement corresponding to the conductor arrangement of FIG. 7 as a conductor network of electrically connected conductor meshes $M_1$ through $M_3$ whose course is shown with broken lines next to the actual conductor meshes $M_1$ through $M_3$. Each of the conductor meshes $M_1$ through $M_3$ thereby contains at least one current source $SQ_1$ through $SQ_3$ controllable independently from one another. The current paths of the source currents $I_1$ through $I_3$ of the current sources $SQ_1$ through $SQ_3$ thereby close exclusively via the extreme right, vertical conductor path. For an equivalent current distribution as in FIG. 7, the source currents $I_1$ through $I_3$ in FIG. 8 can be specified directly from a current balance of the immediately proximate, vertical conductor paths from FIG. 7. The source currents $I_1$ through $I_3$ respectively amount to 1 A for this example.

The above example shows that a power saving can be achieved compared to a conductor arrangement with mutually insulated conductor meshes in a conductor network since unnecessary dissipated power is not produced in the inside of the line network.

An unambiguous current path necessarily exists for each source current given conductor arrangements with conductor meshes galvanically insulated from one another. In contrast thereto, an unambiguous current path is not necessarily defined given conductor networks, so that the current distribution can be indefinite. However, conductor arrangements composed of mutually insulated conductor meshes are usually affected by a poor efficiency, as graphically explained on the basis of FIGS. 7 and 8. The cause is that only half the conductor crossection of a comparable conductor path of a conductor network is usually available for conductor paths of neighboring conductor meshes that nearly topically coincide, so that a correspondingly high dissipated power arises, and also that oppositely directed currents at least partially compensate in the coinciding conductor paths of neighboring conductor meshes.

Figure 9:
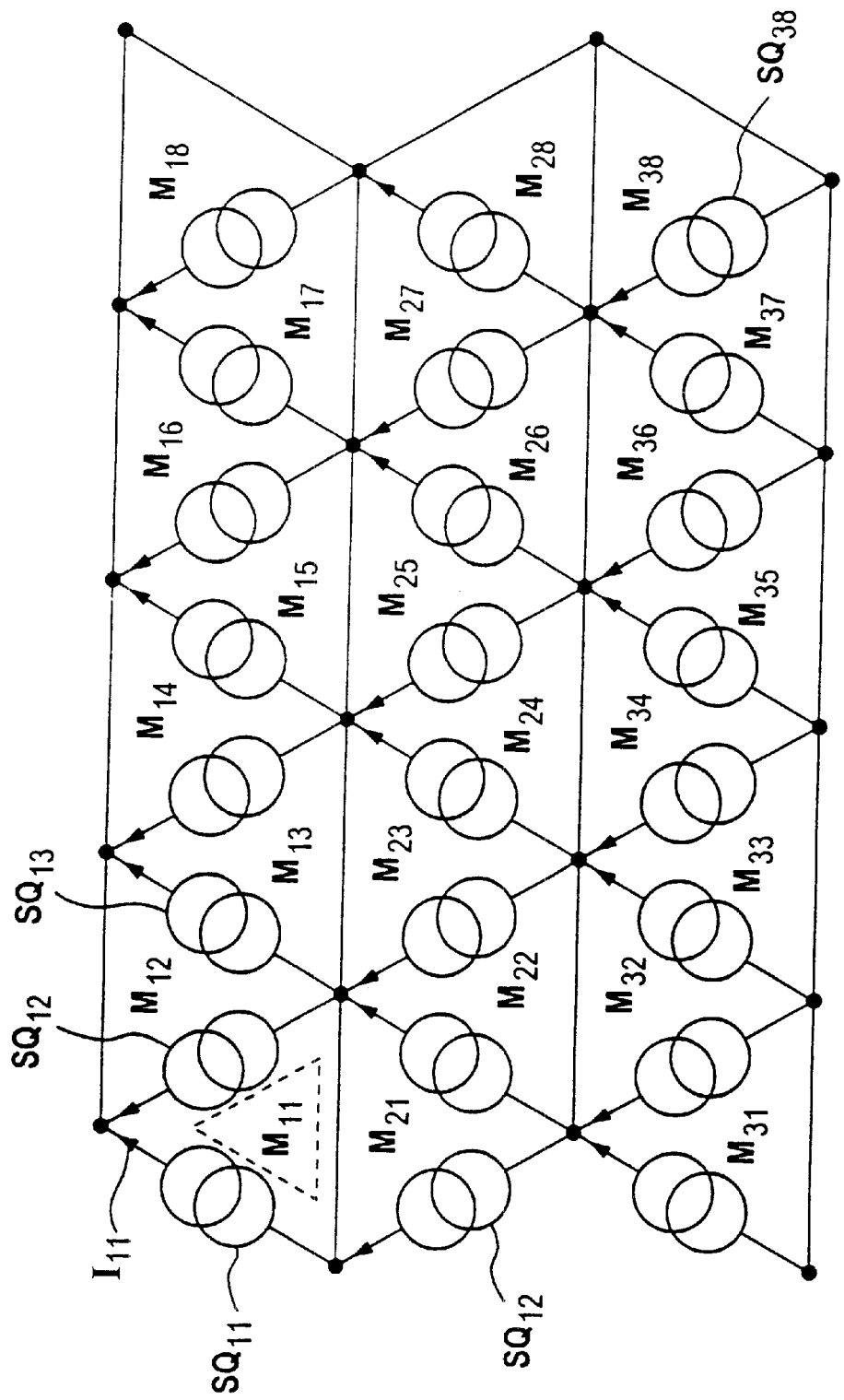
FIGS. 9–11 respectively show planar inventive conductor networks with internal network current sources and a regular network structure of triangles, rectangles and hexagons.
Figure 10:
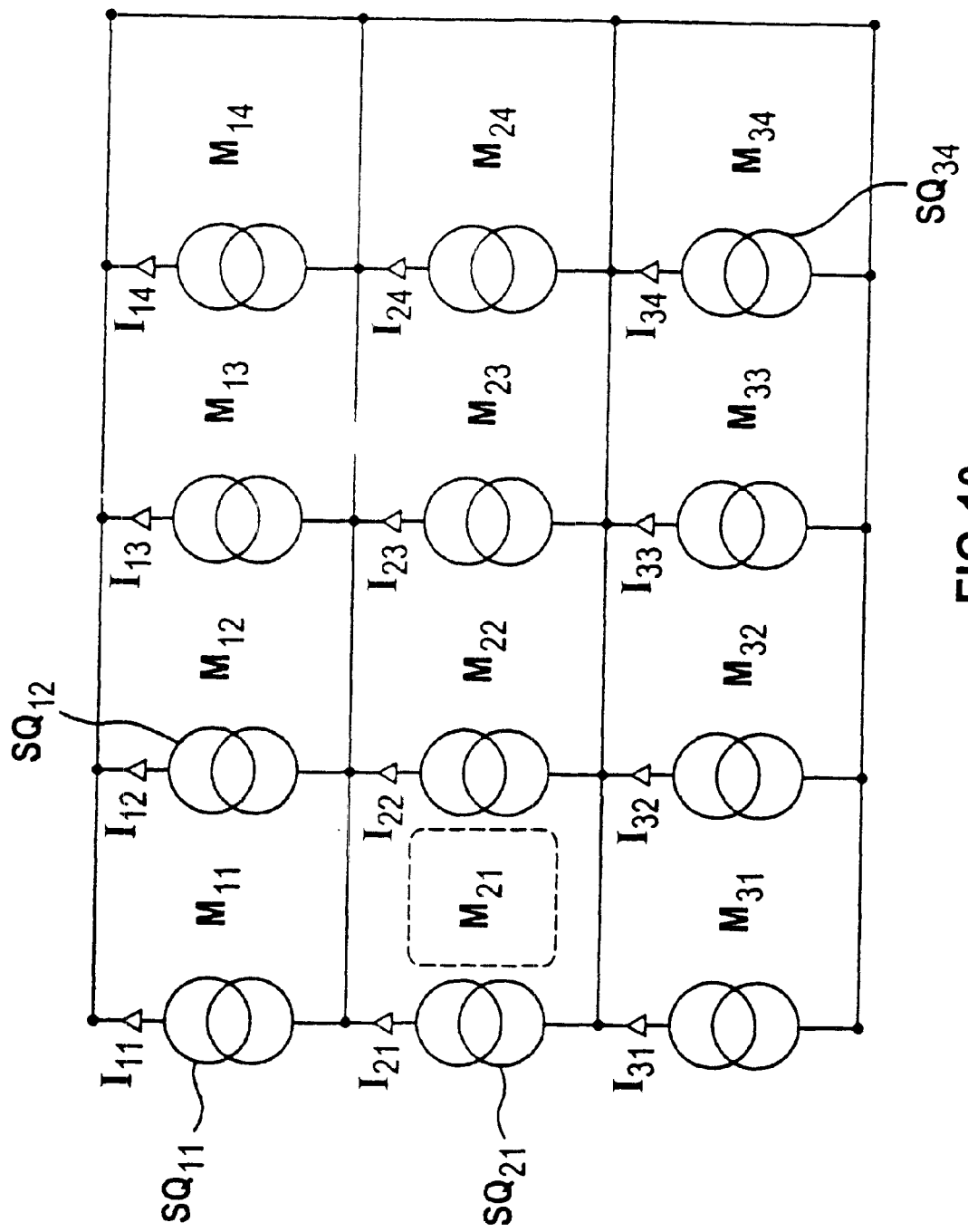
Figure 11:
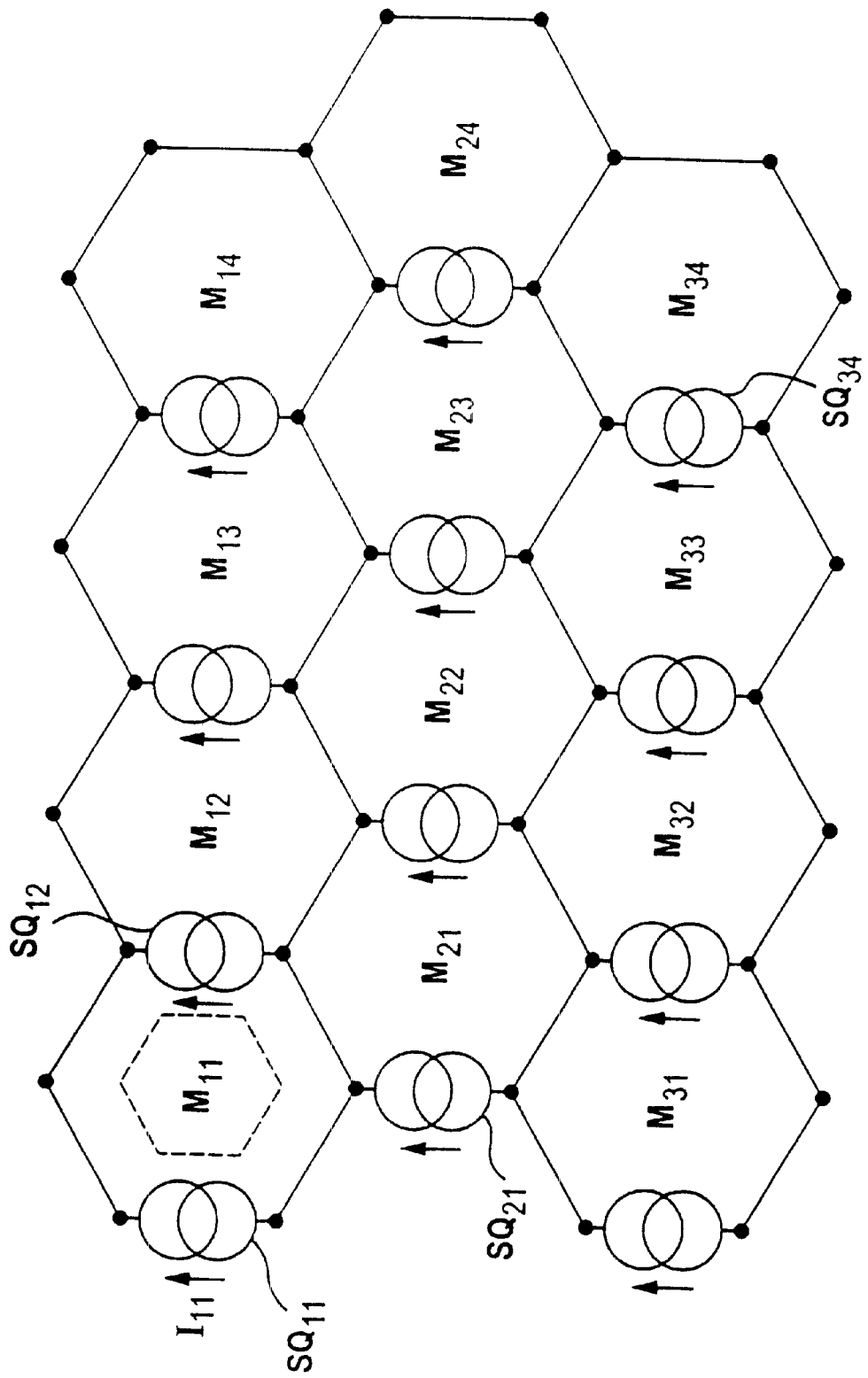

As exemplary embodiments of the invention, FIGS. 9 through 11 show conductor networks with a regular network structure of triangles, squares or hexagons. To that end, conductor meshes $M_{11}$ through $M_{38}$ are electrically connected to one another. It is characteristic of these conductor networks that exactly one unambiguous current path derives for each source current $I_{11}$ through $I_{38}$ of a current source $SQ_{11}$ through $SQ_{38}$. In FIGS. 9 through 11, this current path always leads horizontally from terminal of one of the current sources $SQ_{11}$ through $SQ_{38}$ to the extreme right, via the vertical conductor path free of a current source that belongs to the same row as the current source $SQ_{11}$ through $SQ_{38}$ and, finally, again leads horizontally back to the other terminal of the current source $SQ_{11}$ through $SQ_{38}$. As a result, currents on the current paths are not dependent on impedances in the conductor path that is traversed but are established only by the impressed source current $I_{11}$ through $I_{38}$ of the respective current source $SQ_{11}$ through $SQ_{38}$. Current paths of a source current $I_{11}$ through $I_{38}$ are thus always limited onto the row appertaining thereto. A current path is not formed in the column direction.

For clarity, FIGS. 9 though 11 respectively show only the curve for one of the conductor meshes $M_{11}$ through $M_{38}$ with a broken line next to the actual conductor mesh, and all source currents $I_{11}$ through $I_{38}$ and all current sources $SQ_{11}$ through $SQ_{38}$ are not referenced in each figure. The same is true of FIGS. 12 through 14.

Figure 12:
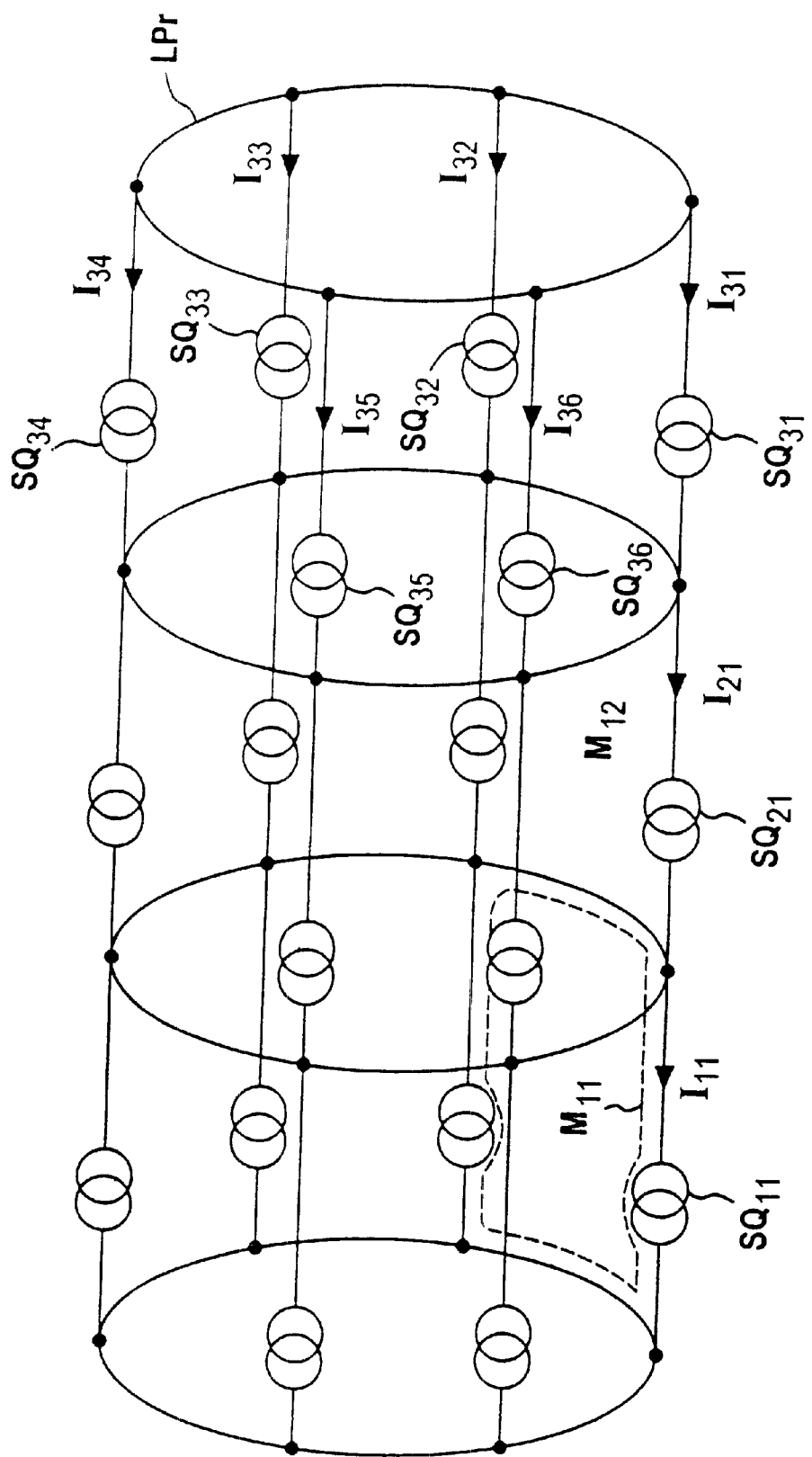
FIGS. 12–14 respectively show cylindrical envelope-shaped inventive conductor networks with internal network current sources and with a network structure of rectangles.

As an exemplary embodiment of the invention, FIG. 12 shows a conductor network with a network structure of regular rectangles that are arranged on a generated surface of a cylinder. The aforementioned conductor thereby clearly arises by rolling up the conductor network shown in FIG. 10 from left to right, whereby the outermost, right, vertical conductor path free of current sources is eliminated and the open nodes that thereby arise are correspondingly connected to the outermost, left, vertical conductor path.

In contrast to FIG. 10, only closed current paths are thus possible in FIG. 12 that contain no current source $SQ_{11}$ through $SQ_{36}$ at all or contain at least two of the current sources $SQ_{11}$ through $SQ_{36}$. This means that no arbitrary source currents $I_{11}$ through $I_{36}$ can be prescribed. This becomes clear when, for example, one imagines an envelope placed around the right, ring-shaped conductor path LPr free of current sources that completely envelopes the latter. Since no charges can accumulate within the envelope, a sum of all source currents $I_{31}$, $I_{32}$, $I_{33}$, $I_{34}$, $I_{35}$ and $I_{36}$ at the right-hand, ring-shaped conductor path LPr free of current sources must yield zero according to Kirchhoff's law. Six current sources $SQ_{31}$, $SQ_{32}$, $SQ_{33}$, $SQ_{34}$, $SQ_{35}$ and $SQ_{36}$ are connected to said conductor path LPr, but these are not linearly dependent on one another due to Kirchhoff's law since, for example, the source current $I_{36}$ of a sixth current source $SQ_{36}$ is defined by the source currents $I_{31}$, $I_{32}$, $I_{33}$, $I_{34}$ and $I_{35}$ of the remaining current sources $SQ_{31}$, $SQ_{32}$, $SQ_{33}$, $SQ_{34}$ and $SQ_{35}$. An underdefined equation system derives as a result thereof, i.e. there are infinitely many solutions for the currents in the ring-shaped conductor path LPr free of current sources. The same is true of the other ring-shaped conductor paths free of current sources.

In contrast to the planar conductor arrangement of FIG. 10, the current path of a source current $I_{11}$ through $I_{36}$ is not unambiguously prescribed in FIG. 12. For example, a source current supplied into the right-hand, ring-shaped conductor path LPr free of current sources divides into two sub-currents in that one part of the source current $-I_{31}$ continues in a left direction and another part continues in a right direction. The division is thereby dependent on the individual impedances of the sections of the ring-shaped conductor path LPr between the terminal points of the longitudinal conductor paths.

Moreover, for example given the use of the conductor network according to FIG. 12 in a hollow-cylindrical gradient coil system of a magnetic resonance system, currents that produce a disturbing magnetic field can be induced in the ring-shaped conductor paths. In order to prevent this, the ring-shaped conductor paths are to be implemented parted at a location or—in order to avoid said asymmetry in circumferential direction—four conductor networks according to FIG. 10 are arranged in four quadrants of the cylinder jacket, each of these covering a respective 90° region of the cylindrical jacket proceeding in circumferential direction.

Figure 13:
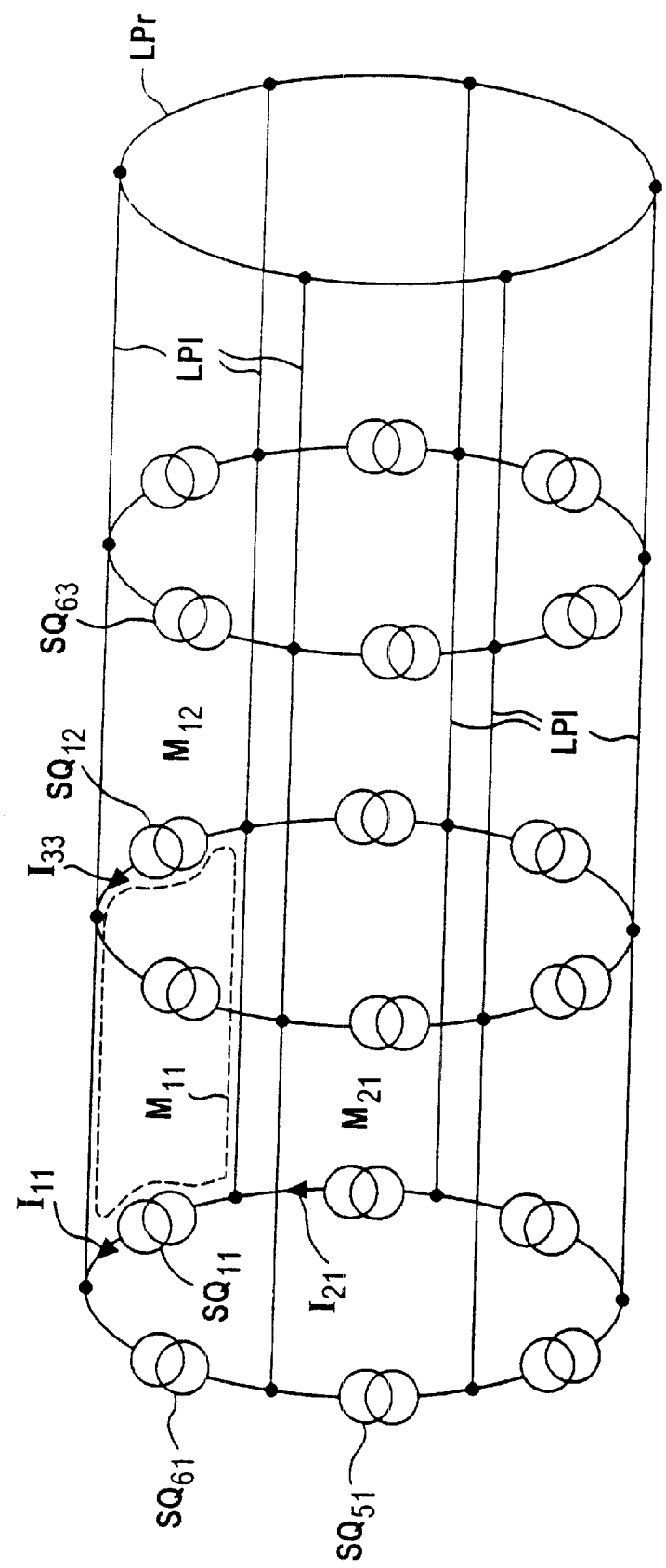

As a further exemplary embodiment of the invention, FIG. 13 shows a conductor network on a generated cylinder surface. The conductor network thereby clearly arises by rolling up the conductor network of FIG. 10 from top to bottom, whereby the uppermost and the lowest horizontal conductor path free of current forces fuse with one another. In FIG. 12, thus, a ring-shaped conductor path free of current sources arises from the right-hand, vertical conductor path free of current sources in FIG. 10.

In the conductor network according to FIG. 13, source currents $I_{11}$ through $I_{63}$ of the current sources $SQ_{11}$ through $SQ_{63}$ can be arbitrarily selected since the source currents $I_{11}$ through $I_{63}$ can always flow via a conductor path free of current sources that contains a section of the ring-shaped conductor path LPr free of current sources. However, the current paths of the source currents $I_{11}$ through $I_{63}$ are not unambiguous since, similar to FIG. 12, two current paths are always possible in the ring-shaped conductor path LPr free of current sources. In contrast thereto, the course of the current in the longitudinal conductor paths LP1 is unambiguous. Comparable to a planar network structure, a source current $I_{11}$ through $I_{63}$ generated by one of the current sources $SQ_{11}$, through $SQ_{63}$ flows all the way to the right via an appertaining, longitudinal conductor path LP1, which it divides in the ring-shaped conductor path LPr onto a sub-current via a short conductor path and via a long conductor path and flows back to the current source $SQ_{11}$ through $SQ_{63}$ via the neighboring longitudinal conductor path LP1. Given a conductor network with a comparatively great number of longitudinal conductor paths LP1 arranged equidistantly from one another, the sub-current via said long conductor path of the ring-shaped conductor path LPr is negligible.

In another embodiment, a current source is inserted for compelling unambiguous current paths in the ring-shaped conductor path LPr. This also has the advantage that no currents induced from the outside can arise via the ring-shaped conductor path LPr. Further, the division of the current in the ring-shaped conductor path LPr is not dependent on different impedances of conductor sections of the ring-shaped conductor path LPr between terminal points of longitudinal conductor paths LP1.

Figure 14:
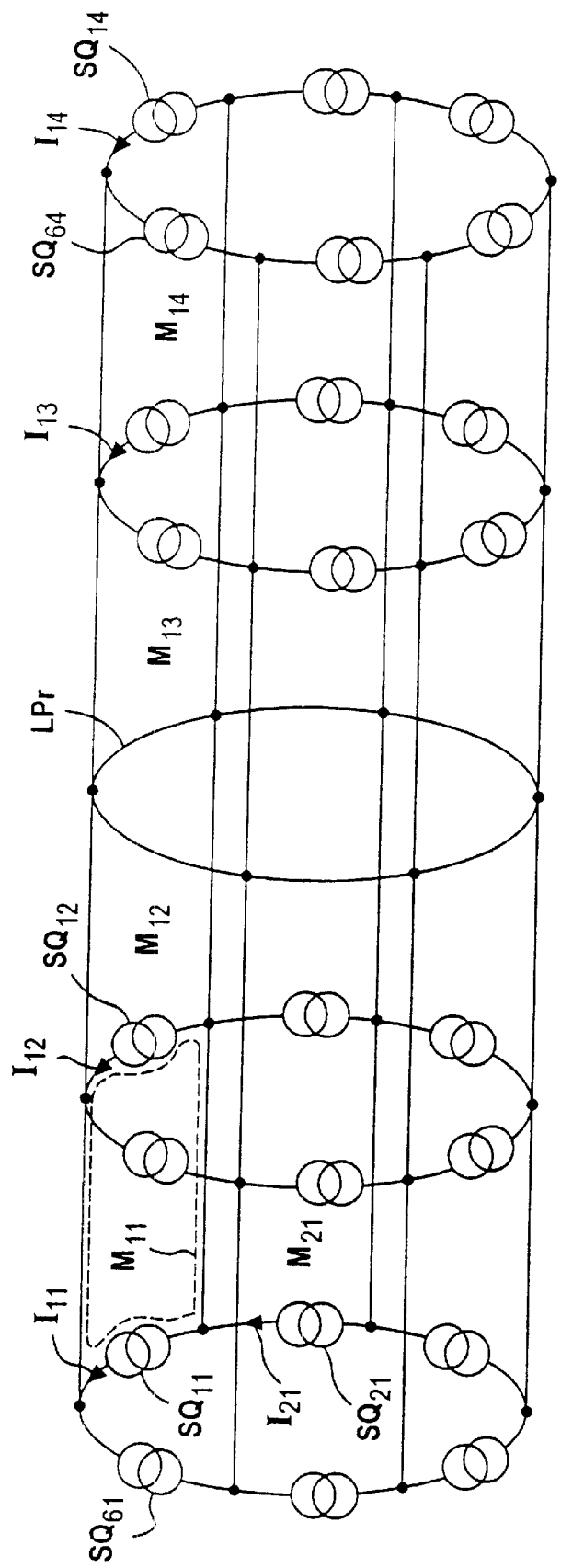

As a further exemplary embodiment of the invention, FIG. 14 shows a further conductor network on a generated surface of a cylinder. In contrast to the conductor arrangement according to FIG. 13, the ring-shaped conductor path LPr free of current sources is arranged in a middle of the cylinder jacket, and an identical plurality of ring-shaped conductor paths having current sources is provided at both sides of the ring-shaped conductor path LPr free of current sources. In particular, the conductor network according to FIG. 14 is suited for employment in a hollow-cylindrical gradient coil system of a magnetic resonance apparatus since no current induction in the ring-shaped conductor path LPr free of current sources thereby occurs in the middle of the cylinder, so that this also can be implemented without an electrically insulatable device, for example a parting or a current source. The description regarding FIGS. 12 through 14 analogously applies to cylindrical jacket-shaped conductor networks that proceed from rolling up the conductor networks of FIGS. 9 and 11 as well as for arrangements other than the cylindrical jacket-shaped arrangement.

In the above-described embodiments of FIGS. 7 through 14, current sources are integrated in conductor meshes or, respectively, into the conductor network. These network-internal current sources are thereby supplied with energy from the outside via, for example, a voltage distribution network.

A comb-like voltage distribution network proceeding in the direction of the principal axis of the cylinder is advantageous for supplying the supply voltage for a cylindrical jacket-shaped network structure. The individual teeth of the comb are thereby connected at the cylinder end in circumferential direction via a two-wire conductor ring that is interrupted at a location. A short linking of internal network current sources to the supply voltage is possible in this way.

Given internal network current sources, only limited space is available and an elimination of waste heat of the internal network current sources is possible to only a limited extent. Further, low amplitude control lines are to be provided for the current sources, these being fashioned as thin metallic lines, light conductors or as a bus system. When the internal current sources are implemented as pulse width-modulated current sources, further, a filtering of the source currents is comparatively employed.

Since, in a conductor network, both poles of each current source are galvanically in communication with the poles of every other current source in some way or other via the conductor network, the current sources are to be galvanically decoupled from one another, i.e. floating current sources are utilized, these having all poles galvanically separated from one another.

In one embodiment, a shared voltage distribution network is therefore provided for the energy supply of internal current sources, whereby a galvanic decoupling of the internal current sources is capacitively or inductively realized on site. For space reasons, a capacitive decoupling is advantageous. For an adequate decoupling, the frequency of the supply voltage is therefore selected significantly higher than frequencies of spectral components that occur as a result of load variations of the current sources. given a conductor arrangement of conductor meshes insulated from one another, said task of galvanic decoupling of current sources does not arise. Embodiments of the internal network current sources are discussed in greater detail on the basis of FIGS. 18 through 20.

Figure 15:
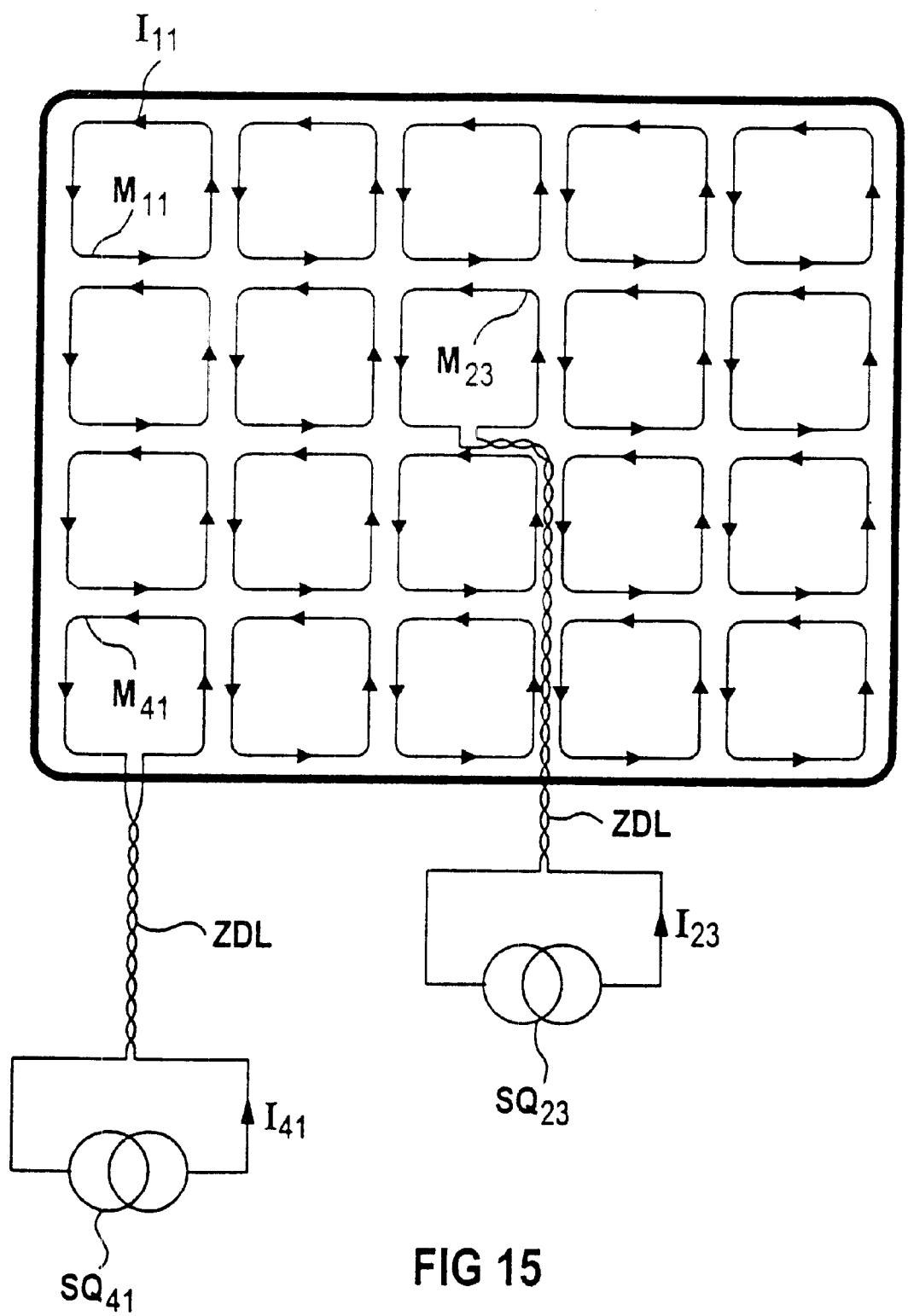
FIG. 15 shows a planar inventive conductor arrangement with conductor meshes insulated from one another and with current sources located outside the network structure.

FIG. 15 shows an exemplary embodiment of a conductor arrangement with external current sources. As an example, a conductor arrangement of conductor meshes $M_{11}$ through $M_{45}$ insulated from one another is shown, these being arranged according to a network structure that is constructed of quadratic areas. Each conductor mesh $M_{11}$ through $M_{45}$ has an external current source $SQ_{11}$ through $SQ_{45}$ allocated to it. As an example, the current sources $SQ_{23}$ or, respectively, $SQ_{41}$ are shown for the conductor meshes $M_{23}$ or, respectively, $M_{41}$, these being fashioned as external current sources outside the network structure and being connected to the conductor meshes $M_{23}$ or $M_{41}$ via respective twisted two-wire lines ZDL.

Adequate space is usually present for the current sources $SQ_{11}$ through $SQ_{45}$ in the above described embodiment wherein conductor meshes M11 through M45 are supplied by external current sources $SQ_{11}$ through $SQ_{45}$ arranged outside the network structure via twisted two-wire conductors ZDL. An elimination of the heat generated by the current sources $SQ_{11}$ through $SQ_{45}$ is unproblematical. When the current sources $SQ_{11}$ through $SQ_{45}$ are implemented as pulse width-modulated current sources, such source currents are easy to filter outside the network structure. Further, the individual current sources $SQ_{11}$ through $SQ_{45}$ can be unproblematically galvanically decoupled from one another, for example with an inductive transformer. Moreover, a comparatively large number of conductors ZDL must be introduced into the network structure and these must be able to carry the full source currents $I_{11}$ through $I_{45}$, as a result of which they cannot be made especially thin. The two leads of a two-wire conductor ZDL thus are laid close to one another and, advantageously, are twisted with one another. Given a use of the conductor arrangement in a region which is influenced by the basic magnetic field of the magnetic resonance apparatus, further, the two-lead conductors are laid so as to be electromagnetically compatible, in the direction of the basic magnetic field insofar as possible, so that, no unwanted distortion of the basic magnetic field occurs.

For setting a specific current distribution within the conductor arrangements in the above-described embodiments of FIGS. 7 through 15, each of the conductor meshes is electrically connected to at least one current source for feeding a source current.

Particularly given a conductor network, current feeds that are arranged only at an edge of a network structure are desirable. It is thereby apparent that the above system is usually highly underdefined without additional measures. Thus, a number of independent current paths increases exponentially with an increased number of columns or rows, in contrast to which the feed points available at the edge of the network structure only increase linearly. Unambiguous current paths of the source currents thus can be achieved by switches, for example at nodes of conductor meshes, so that a conductor arrangement than can be freely parameterized in a broad range can be formed on the basis of switches.

Specific demands are particularly made on switches that are arranged within the conductor structure and, for example, exposed to a strong basic magnetic field of a magnetic resonance apparatus: Since a voltage at the open switch is inherently bipolar, the switch is also fashioned bipolar. A drive of the switch ensues in potential-separated fashion since potentials within the conductor arrangement can assume arbitrary values—with reference to a system ground—in a broad range.

Further, the switch must be adapted to the electromagnetic ambient conditions, so that, for example, it is not disrupted by a strong basic magnetic field or a radiofrequency field of a magnetic resonance apparatus and vice versa. To that end, in particular, ferromagnetic component parts should be avoided in the region of influence of the basic magnetic field because they disrupt a homogeneity of the basic magnetic field that is important for the magnetic resonance image quality. The basic magnetic field drive ferromagnetic component parts into saturation, however, so that, for example, inductive transformers having a core of ferromagnetic material cannot be employed.

A dielectric strength of the switch in the off condition is selected such that it is larger than a maximally occurring, induced voltage in one of the conductor paths of the conductor arrangement. A current-carrying capacity of the switch in the on condition is essentially defined by the dimensioning data of the conductor arrangement as well as the geometry thereof. The permissible switching time of the switch is highly dependent on whether the switch is clocked or only quasi-statically operated. MOSFETs and IGBTs compete given an implementation with active switch elements. IGBTs are thereby advantageous compared to MOSFETs only given higher currents to be switched. Due to a lower dissipated power, n-channel types are advantageous given MOSFETs.

Figure 16:
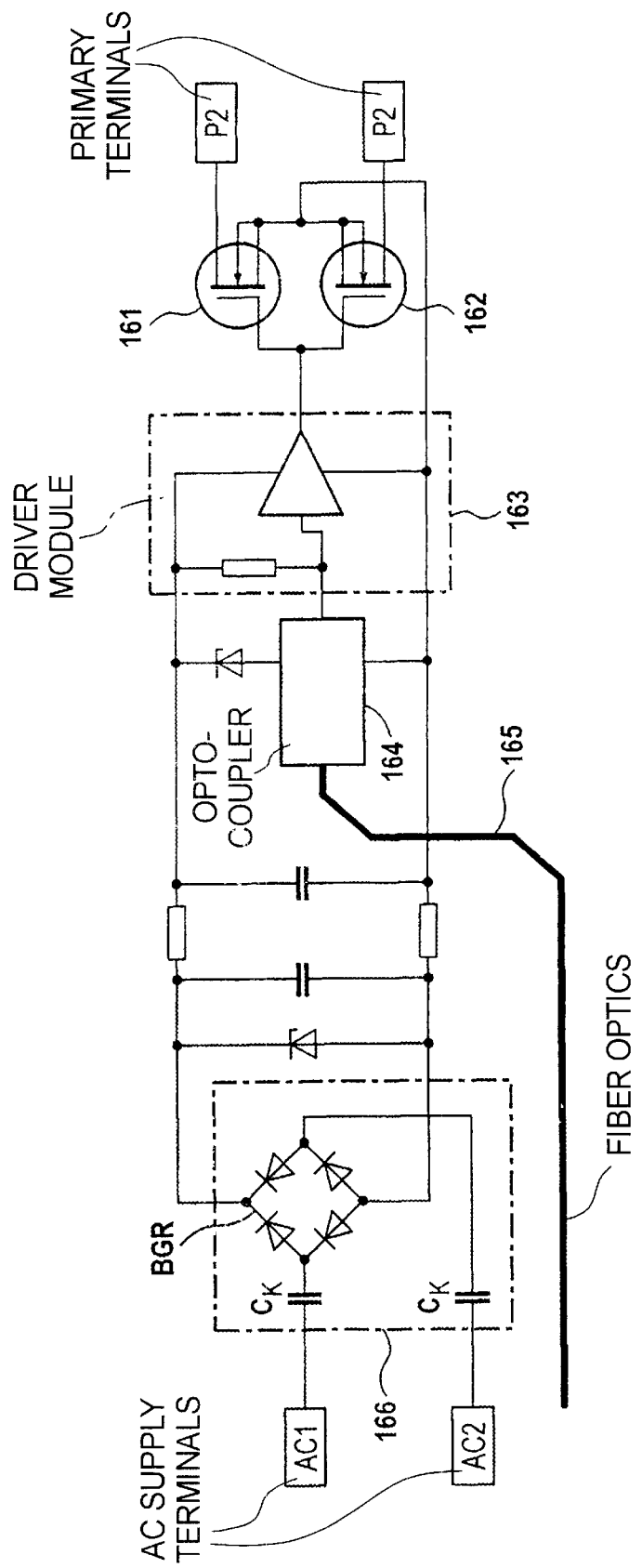
FIG. 16 shows a switch that can be integrated into the inventive conductor arrangement.

FIG. 16 shows an embodiment of a switch that can be integrated into a conductor arrangement. To that end, the switch is electrically linked into conductor meshes of the conductor arrangement via the primary terminals P1 and P2 of the switch. A bipolar switch is realized by two n-channel MOSFETs 161 and 162 with opposite polarity. It is advantageous to interconnect the two source terminals of the MOSFEts 161 and 162, so that the gate terminals can directly connected to one another, and the bipolar switch can be controlled via a single gate-source voltage in this way. A control signal for the switch as well as a dc voltage supply for an auxiliary switch electronics are implemented potential-free. The potential separation for the control signal ensues with fiber optics and an opto-coupler 164. The type SFH551 of Siemens AG or HFBR-25X1 of Hewlett Packard can be utilized as opto-coupler 164. A driver module 163 is provided for a fast drive. The potential separation between the high-frequency supply a.c. voltage that is adjacent at the supply terminals AC1 and AC2 and the dc voltage for the auxiliary switch electronics ensues via a capacitative voltage transformer 166 that has two coupling capacitors $C_K$ and a bridge rectifier BGR. A functioning of the potential separation is dependent on an identical utilization of both half-waves of the supply a.c. voltage, which is assured by the bridge rectifier BGR. The coupling capacitors $C_K$ are selected so small that no noteworthy spectral parts of currents to be set in the conductor arrangement flow off via them. In another embodiment, the gate terminals of the MOSFETs 161 and 162 are charged and discharged with a photodiode array directly via the light waveguide 165.

Figure 17:
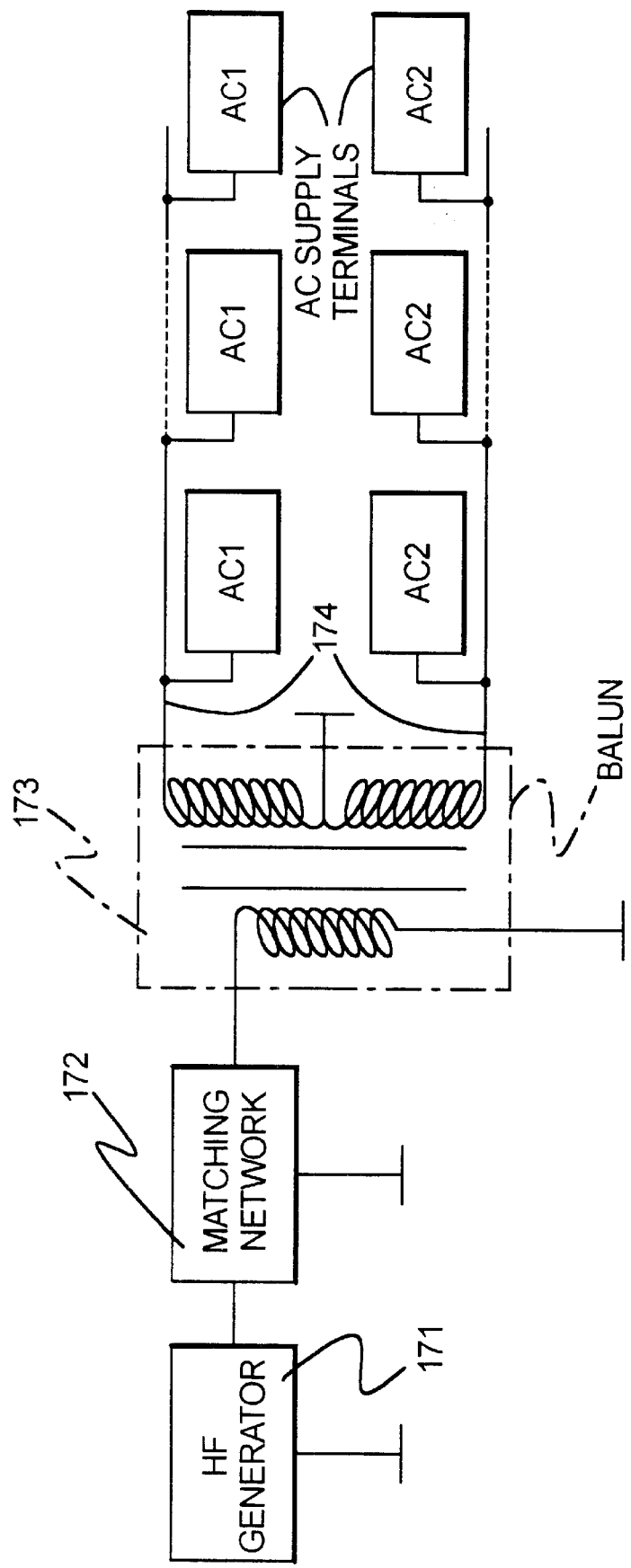
FIG. 17 shows a voltage distribution network for a plurality of integratable switches.

As an embodiment, FIG. 17 shows a voltage distribution network for a number of such switches. An alternating voltage supply that is symmetrical to ground is provided via a balun transformer 173. A shared symmetrical supply line 174 is looped through to alternating voltage supply terminals AC1 and AC2 of each and every switch. A high-frequency generator 171 is implemented, for example, as a 50 Ω sine generator that is followed by a matching network 172 that compensates the capacitative load part and implements an impedance transformation. In another embodiment, the high-frequency generator 171 is fashioned as a low-impedance square-wave generator, and the balun transformer 173 is formed of two controllable half-bridges with a 180° phase offset relative to one another.

Figure 18:
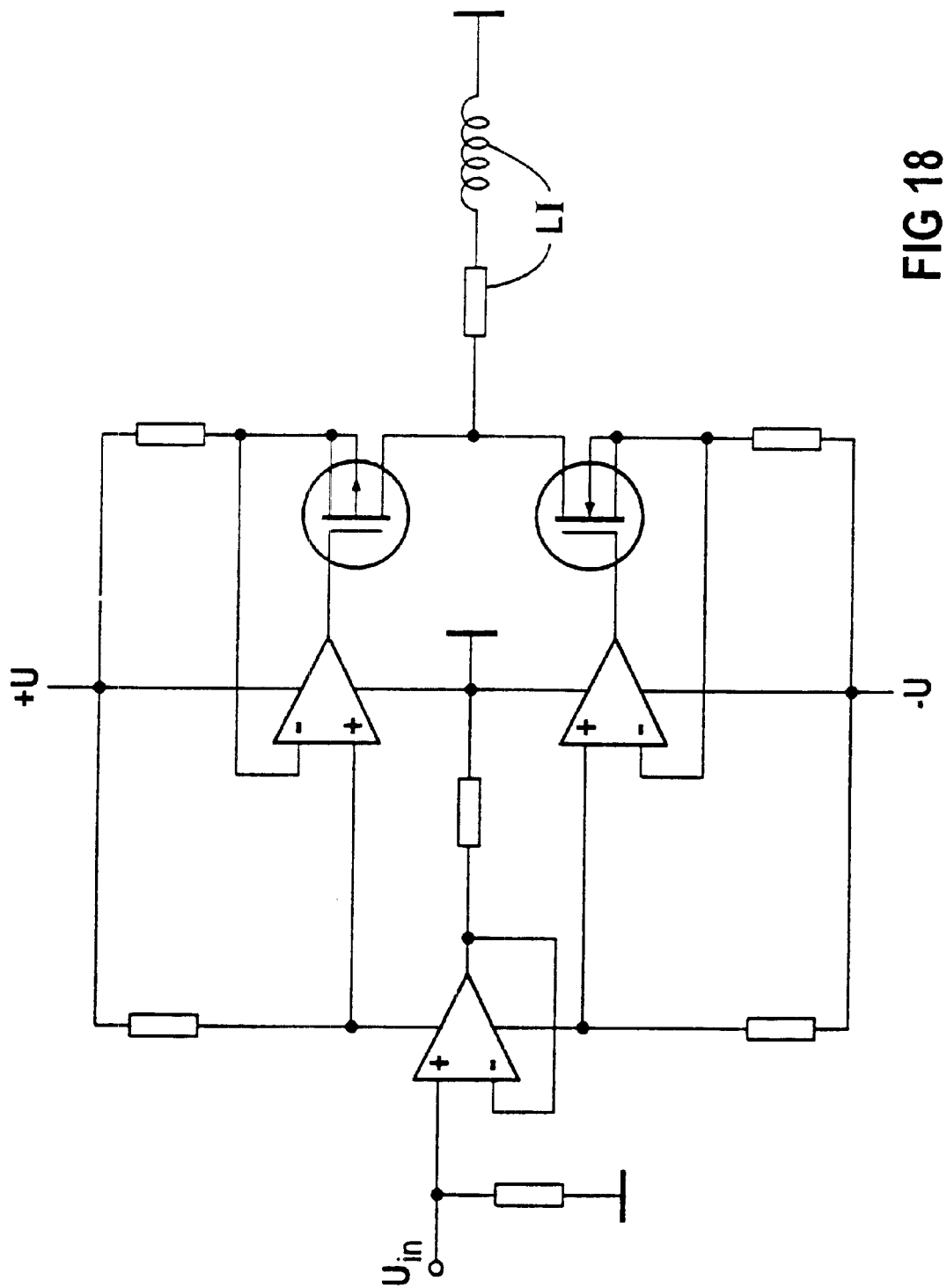
FIG. 18 shows a linear, voltage-controlled bipolar current source in push-pull AB mode.
Figure 19:
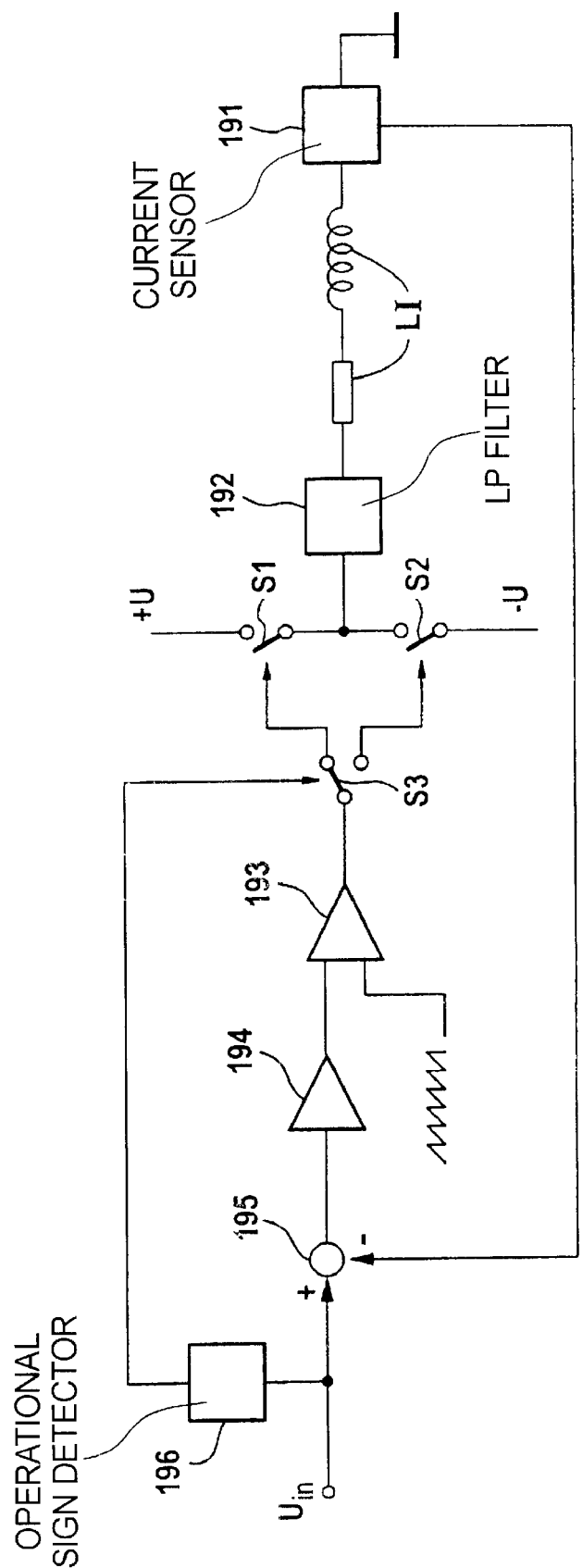
FIG. 19 shows a current source that can be operated with pulse-width modulation.
Figure 20:
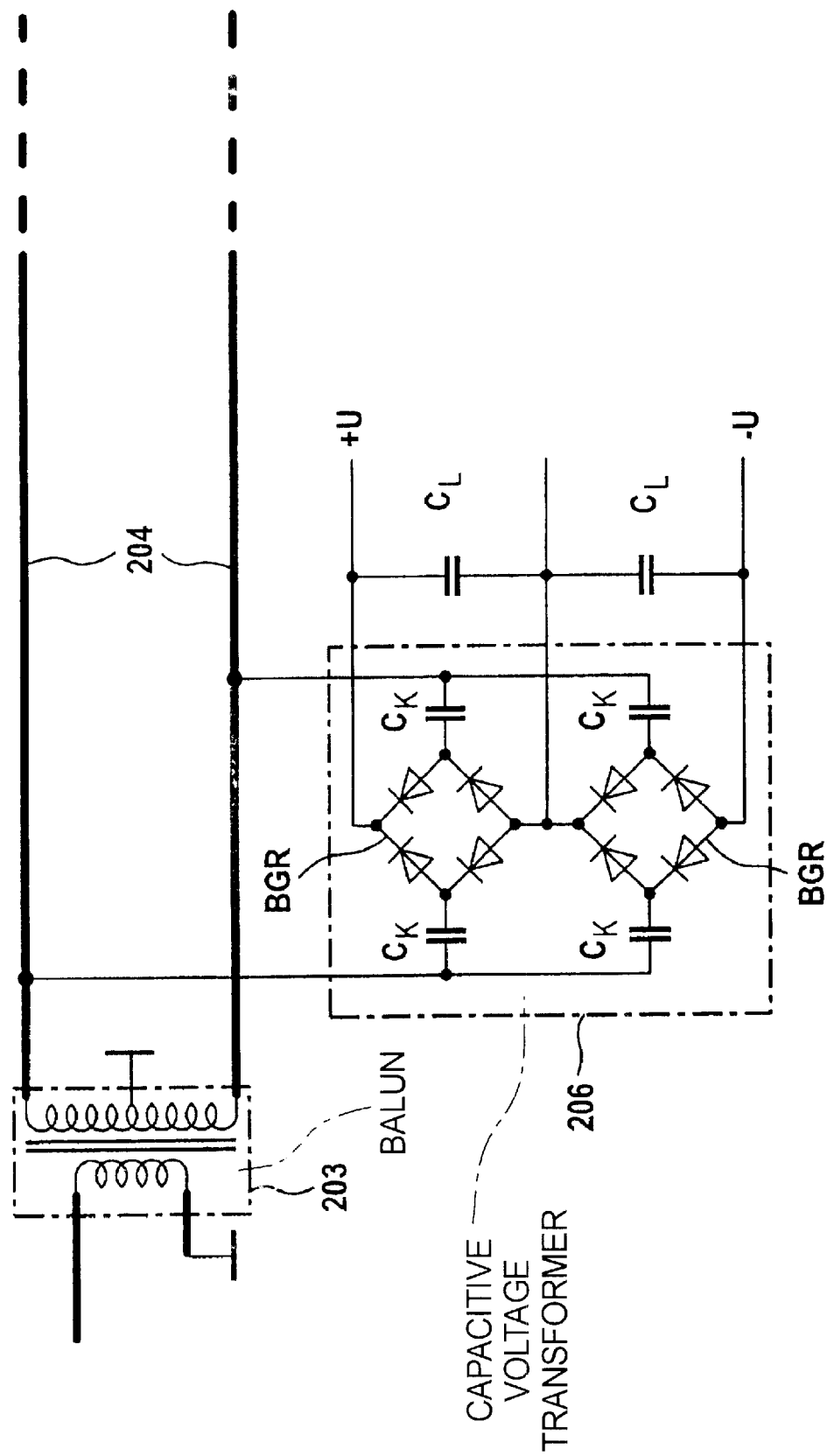
FIG. 20 shows a voltage distribution network and a voltage transformer for one of the current sources.

FIG. 18 through 20 show exemplary embodiments particularly for internal network current sources and their voltage supply. FIG. 18 thereby shows a linear current source, FIG. 19 a current source that can be operated pulse width-modulated, and FIG. 20 shows a corresponding power supply for the current sources.

Linear current sources are inherently high-impedance. This has the advantage that a conductor mesh that is supplied with current induces no currents in a neighboring conductor mesh that is coupled to it via coupling inductances. The overall conductor arrangement is thus decoupled, so that no correction matrices or control circuits are required. Linear current sources, however, exhibit a comparatively high dissipated power. In order to keep this within limits, current sources in the push-pull AB mode or push-pull A mode are provided.

To that end, FIG. 18 shows an exemplary embodiment of a linear voltage-controlled bipolar current source in push-pull AB mode that is suitable for comparatively high output currents due to a load impedance LI. The bipolar current source for supplying a dc voltage that is symmetrical to ground, has the supply terminals +U and −U and a control voltage terminal $U_{in}$ for controlling the current source via a control voltage. The functioning of the circuit of FIG. 18 is described, for example, in the book by U. Tietze et al., *Halbleiterschaltungstechnik*, $9^{th}$ Edition, Springer-Verlag, Berlin, 1990, pages 374 through 378.

FIG. 19 shows an embodiment of a current source that can be operated pulse width-modulated and that can be operated with lower losses than the linear current source described above. Given the illustrated pulse width-modulated current source, a current that varies slowly compared to the switching clock can be impressed into a load impedance LI by a fast switching—with the switches S1 and S2—of a dc voltage that is across the supply terminals +U and −U. The average current flowing in the load impedance LI following a low-pass filter 192 can be controlled by the pulse-duty factor of the two switches S1 and S2. The current can thereby be regulated with a control loop. The control loop has a current sensor 191, a comparator 195, a regulator 194 and a comparator 193. With an operational sign detector 196 for a control voltage at the control voltage input $U_{in}$, further, an improved-efficiency switching operation of the switches S1 and S2 can be controlled by the drive of a further switch S3. The switch S2, for example, remains open for generating a specific positive voltage at the input of the low-pass filter 192 and only the switch S1 is switched.

For a fast discharge of the load impedance circuit, a further switch to ground is provided before the low-pass filter 192 in one embodiment. In one embodiment with the pulse width-modulated current source, only the switches S1 and S2, the low-pass filter 192 and the current sensor 191 are integrated into the conductor arrangement, and the other component parts are correspondingly relocated.

In an embodiment, FIG. 20 shows a voltage distribution network for a number of current sources with a voltage transformer for one of the current sources. The voltage distribution network and the voltage transformer are fashioned similar to those of FIGS. 16 and 17. Corresponding to FIG. 17, a balun transformer 203 and a symmetrical a.c. voltage supply line 204 are shown in FIG. 20. Compared to the embodiment of FIG. 16, the capacitive voltage transformer 206 shown in FIG. 20 has two bridge rectifiers BGR, so that two voltages, that are of the same size in terms of magnitude with respect to a mid-potential point are obtained for the dc voltage supply terminals +U and −U, and thus load currents of different amplitudes are allowed to flow in the positive and in the negative voltage branches. For a satisfactory efficiency, the capacitances of the coupling capacitors $C_K$ are regulatable synchronously with the load current, so that the voltages at the load capacitors $C_L$ can be set optimally load-independent.

Although modifications and changes may be suggested by those skilled in the art, it is the intention of the inventor to embody within the patent warranted hereon all changes and modifications as reasonably and properly come within the scope of his contribution to the art.

We claim as our invention:

1. An electrical conductor arrangement for a magnetic resonance apparatus comprising:
   a plurality of conductor meshes forming a conductor arrangement;
   said conductor meshes being arranged in a plurality of respective areas having respective limiting lines defined by a network structure; and
   a plurality of control devices respectively electrically connected in said conductor meshes for actively controlling respective currents within said conductor arrangement.

2. An electrical conductor arrangement as claimed in claim 1, wherein said conductor meshes are electrically insulated from one another.

3. An electrical conductor arrangement as claimed in claim 1, wherein at least one of said conductor meshes has a shape corresponding to the limiting line of the area in which said at least one of said conductor meshes in arranged.

4. An electrical conductor arrangement as claimed in claim 1, wherein said conductor meshes proceed according to said limiting lines of said respective areas, with conductor meshes which adjoin each other along a common limiting line having a shared conductor path.

5. An electrical conductor arrangement as claimed in claim 1 wherein said areas tile a total area of said network structure without gaps.

6. An electrical conductor arrangement as claimed in claim 1 wherein all of said plurality of areas have identical geometrical shapes.

7. An electrical conductor arrangement as claimed in claim 1 wherein at least one of said areas has a shape selected from the group consisting of triangular, rectangular and hexagonal.

8. An electrical conductor arrangement as claimed in claim 1 wherein said network structure is disposed on a surface of a three-dimensional body.

9. An electrical conductor arrangement as claimed in claim 1 wherein said network structure surrounds a cylindrical surface.

10. An electrical conductor arrangement as claimed in claim 9 further comprising a plurality of conductor paths which are free of said control devices, said conductor paths proceeding in a longitudinal direction of said cylinder.

11. An electrical conductor arrangement as claimed in claim 9 comprising a conductor path free of said control devices disposed in a circumferential direction of said cylinder.

12. An electrical conductor arrangement as claimed in claim 11 wherein said conductor path is disposed in a middle of said cylinder.

13. An electrical conductor arrangement as claimed in claim 12 wherein said meshes include a first set of conductor paths respectively containing said control devices and a second set of conductor paths respectively containing said control devices, said first and second sets of conductor paths being disposed in said circumferential direction at respective opposite sides of said conductor path in said middle of said cylinder.

14. An electrical conductor arrangement as claimed in claim 11 further comprising an electrically insulatable device connected in said conductor path that is free of said control devices.

15. An electrical conductor arrangement as claimed in claim 1 wherein each of said conductor meshes contains one of said control devices therein.

16. An electrical conductor arrangement as claimed in claim 1 wherein at least one of said control devices is a controllable current source.

17. An electrical conductor arrangement as claimed in claim 16 wherein said controllable current source contains a plurality of components with at least some of components arranged within said network structure.

18. An electrical conductor arrangement as claimed in claim 16 wherein said current source is connected outside of said network structure.

19. An electrical conductor arrangement as claimed in claim 16 wherein said current source is a bipolar current source.

20. An electrical conductor arrangement as claimed in claim 16 wherein said current source is a pulse width modulated current source.

21. An electrical conductor arrangement as claimed in claim 1 wherein said control device is a switch.

22. An electrical conductor arrangement as claimed in claim 21 wherein said switch is disposed at a node of two of said conductor meshes.

23. An electrical conductor arrangement as claimed in claim 21 wherein said switch comprises at least one power semiconductor component selected from the group consisting of MOSFETs and IGBTs.

24. An electrical conductor arrangement as claimed in claim 1 wherein said conductor arrangement comprises a voltage distribution network operable at a high frequency a.c. voltage.

25. An electrical conductor arrangement as claimed in claim 24 further comprising a potential-separating voltage transformer connecting said control devices to said voltage distribution network, said potential-separating voltage transformer generating a d.c. voltage from said high frequency a.c. voltage, said potential-separating voltage transformer comprising coupling capacitors and at least one bridge rectifier.

* * * * *